United States Patent
Schmitz et al.

(10) Patent No.: US 8,154,094 B2
(45) Date of Patent: Apr. 10, 2012

(54) MICROMECHANICAL COMPONENT HAVING A CAP HAVING A CLOSURE

(75) Inventors: Volker Schmitz, Pfullingen (DE); Axel Grosse, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 750 days.

(21) Appl. No.: 12/158,483

(22) PCT Filed: Nov. 30, 2006

(86) PCT No.: PCT/EP2006/069125
§ 371 (c)(1),
(2), (4) Date: Oct. 23, 2008

(87) PCT Pub. No.: WO2007/074018
PCT Pub. Date: Jul. 5, 2007

(65) Prior Publication Data
US 2009/0090531 A1     Apr. 9, 2009

(30) Foreign Application Priority Data
Dec. 27, 2005 (DE) .................. 10 2005 062 554

(51) Int. Cl.
*G01L 9/00* (2006.01)
*G01P 15/08* (2006.01)
*H04R 23/00* (2006.01)

(52) U.S. Cl. .. 257/417; 257/418; 257/419; 257/E29.324

(58) Field of Classification Search ............... 257/417, 257/418, 419, E29.324
See application file for complete search history.

(56) References Cited

U.S. PATENT DOCUMENTS

| | | | | |
|---|---|---|---|---|
| 5,058,856 A | * | 10/1991 | Gordon et al. | 251/11 |
| 5,284,179 A | * | 2/1994 | Shikida et al. | 137/334 |
| 5,380,396 A | * | 1/1995 | Shikida et al. | 216/2 |
| 5,634,636 A | * | 6/1997 | Jackson et al. | 271/225 |
| 5,897,097 A | * | 4/1999 | Biegelsen et al. | 251/129.01 |
| 6,032,923 A | | 3/2000 | Biegelsen et al. | |
| 6,131,879 A | * | 10/2000 | Kluge et al. | 251/129.06 |
| 6,142,444 A | * | 11/2000 | Kluge | 251/129.06 |
| 6,578,816 B1 | | 6/2003 | Lille | |
| 7,041,225 B2 | | 5/2006 | Lutz | |
| 7,195,393 B2 | * | 3/2007 | Potter | 366/114 |
| 7,607,455 B2 | * | 10/2009 | Furukawa et al. | 137/833 |
| 2005/0184382 A1 | | 8/2005 | Chen et al. | |
| 2006/0203321 A1 | * | 9/2006 | Goossen | 359/245 |
| 2007/0277616 A1 | * | 12/2007 | Nikkel et al. | 73/715 |

FOREIGN PATENT DOCUMENTS

| | | |
|---|---|---|
| DE | 19511022 | 6/1996 |
| EP | 0543 427 | 5/1993 |
| EP | 0546427 | 6/1993 |
| EP | 1274648 | 1/2003 |

(Continued)

OTHER PUBLICATIONS

International Search Report, PCT International Patent Application No. PCT/EP2006/069125, dated Mar. 12, 2007.

(Continued)

*Primary Examiner* — Ngan Ngo
(74) *Attorney, Agent, or Firm* — Kenyon & Kenyon LLP

(57) ABSTRACT

A micromechanical component having a substrate, having a cavity and having a cap that bounds the cavity. The cap has an access opening to the cavity. The cap has a diaphragm for closing the access opening.

7 Claims, 6 Drawing Sheets

FOREIGN PATENT DOCUMENTS

| | | |
|---|---|---|
| FR | 2864340 | 6/2005 |
| JP | 9-82828 | 3/1997 |
| JP | 10-153617 | 6/1998 |
| WO | WO 97/01054 | 1/1997 |
| WO | WO 01/58804 | 8/2001 |
| WO | WO 2004/037711 | 5/2004 |
| WO | WO 2005/061374 | 7/2005 |

OTHER PUBLICATIONS

Bartek, M et al.: "Vacuum sealing of microcavities using metal evaporation" Sensors and Actuators A, Elsevier Sequoia S.A., Lausanne, CH, vol. 61, No. 1-3, Jun. 1997, pp. 364-368, XP004092251.

* cited by examiner

MICROMECHANICAL COMPONENT HAVING A CAP HAVING A CLOSURE

FIELD OF THE INVENTION

The present invention relates to a micromechanical component having a substrate, having a cavity and having a cap that bounds the cavity. The cap has an access opening to the cavity.

BACKGROUND INFORMATION

Micromechanical components are equipped with a cap for special application purposes or just in order to protect them. Glass frit bonding or anodic bonding, inter alia, are conventional for fastening a cap on the component. European Patent No. EP 1 274 648 B1 describes a packaging using thin layers, a so-called SMM encapsulation (SMM—surface micromechanics). The basis of this technology is a perforated layer made of epitaxial polysilicon over a cavity that contains a micromechanical functional element. The perforations allow the cavity to be accessed from the outside during the manufacture of the micromechanical component.

Conventional semiconductor technologies (e.g., oxide or nitride depositions) are described as cap closure, which, however, impose severe boundary conditions on the actual functional element. In this connection, vacuum methods are used and thus also correspondingly low pressures inside the component. In this instance, the composition of the atmosphere in the interior naturally plays only a secondary role.

SUMMARY

The present invention relates to a manufacturing method for a micromechanical component having a substrate, having a cavity and having a cap that bounds the cavity. The cap has an access opening to the cavity. According to an example embodiment of the present invention, a diaphragm is manufactured from suitably structured layers for closing the access opening. Advantageously, it is possible to create a cap over a micromechanical component by depositing and structuring a diaphragm layer, a sacrificial layer, an etch stop layer and a cap layer, which cap offers, after an etching process, an access that is mechanically closable by a diaphragm located underneath the actual cap.

An advantageous refinement of the example manufacturing method according to the present invention provides for the creation of a cap having an inner diaphragm by manufacturing an additional etch stop layer and an additional sacrificial layer in front of the above-mentioned layers. Advantageously, such a diaphragm may be actuated in two directions of deflection.

The present invention additionally relates to a method for closing a micromechanical component having a substrate, having a cavity and having a cap that bounds the cavity, the cap having an access opening to the cavity and the cap having a diaphragm for closing the access opening. The example method includes the steps of first an interior atmosphere is set in the cavity, which has a specific composition and a specific pressure, afterward the access opening to the cavity is mechanically closed by applying the diaphragm, and the access opening is subsequently closed by the deposition of material. In such a method, the setting of the interior atmosphere and the closing of the cavity are advantageously separated from each other and thus largely independent of each other.

An advantageous refinement of the method for closure provides for the diaphragm to be applied by an induced pressure difference between the cavity and an environment of the component on a part of the access opening. This advantageously allows for the access to be mechanically closed in a particularly simple manner and without direct manipulation on the component.

Another advantageous refinement of the method for closure provides for the diaphragm to be applied by an induced electrostatic action of force on a part of the access opening. This advantageously allows for the access to be mechanically closed at least in part independently of the pressure conditions in the cavity and in the environment of the component.

In one embodiment, the present invention is designed to close the perforation in a cap EPI in such a way that a specific interior atmosphere at a defined interior pressure is set using classical semiconductor technologies (e.g. CVD, vacuum). It is to be seen as a succession of layers together with the associated method. In particular, the present invention yields a synergy effect together with circuit traces in the cavity, which may be used both for conducting electricity and as a diaphragm for closing the access opening.

A particularly advantageous refinement is a flexible diaphragm on the underside of the perforation hole, which allows for the cavity to be ventilated in such a way that gaseous coatings (e.g., antistick coatings) and filler gases may penetrate. A closure is achieved in that by a sharp pressure drop in the outer region of the cavity, the diaphragm is pressed from below over the hole and a seal is achieved. Immediately afterwards, a classical semiconductor deposition process (e.g. CVD or sputtering) for closing the holes is performed in the same facility.

Given a suitable process management and hole geometry, a closure is then possible using semiconductor technologies without additional effort, which will make it possible to set an interior atmosphere with respect to pressure and composition and allow unlimited further processing (apart from boundary conditions on component stress and durability of antistick coatings).

BRIEF DESCRIPTION OF THE DRAWINGS

Exemplary embodiments of the present invention are illustrated in the figures and explained in detail below.

DETAILED DESCRIPTION OF EXAMPLE EMBODIMENTS

An embodiment of the present invention is described below.

Figure 1:
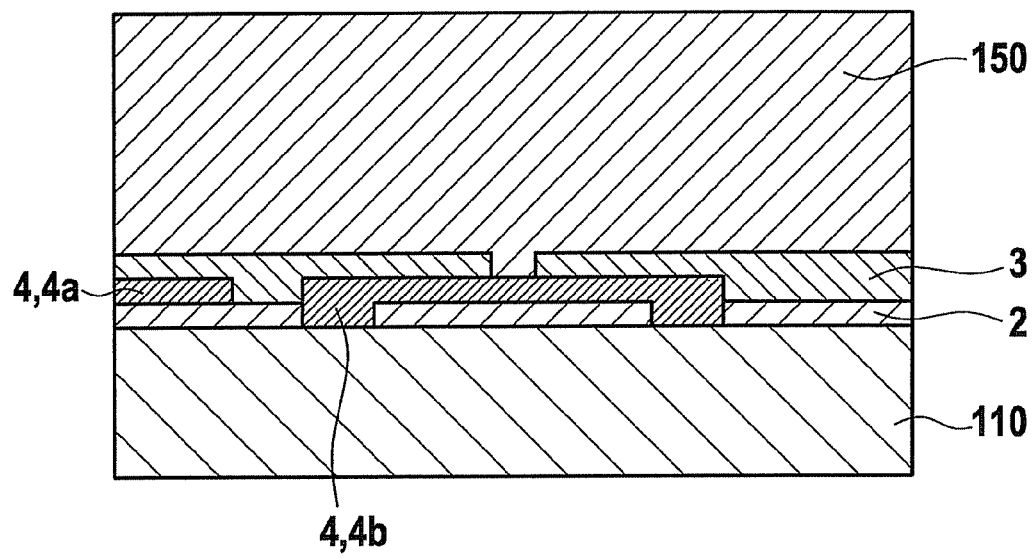
FIG. 1 shows the layer structure of a cap in a preliminary stage of the micromechanical component according to an example embodiment of the present invention having a cap having a closure.

FIG. 1 shows the layer structure of a cap in a preliminary stage of the micromechanical component according to an example embodiment of the present invention having a cap having a closure. Over a micromechanical structure, which is not shown here in detail, a subsequent sacrificial layer, in this case a polysilicon sacrificial layer 110, is deposited. Following the deposition and chemical-mechanical polishing (CMP) of this polysilicon sacrificial layer 110, a lower nitride layer 2, a polysilicon layer 4 and an upper nitride layer 3 are deposited and structured in succession. On top of this a cap epitaxy layer 150 is applied. In this instance, polysilicon layer 4 has subregions 4a and 4b. Lower nitride layer 2 has accesses from subregion 4b to polysilicon sacrificial layer 110. Upper nitride layer 3 has accesses from cap epitaxy layer 150 to subregion 4b. Subregion 4a is in this case geometrically separated from 4b and represents an electrical circuit trace. As protection during the subsequent etching of the sacrificial layer, subregion 4a is coated by nitride.

Figure 2:
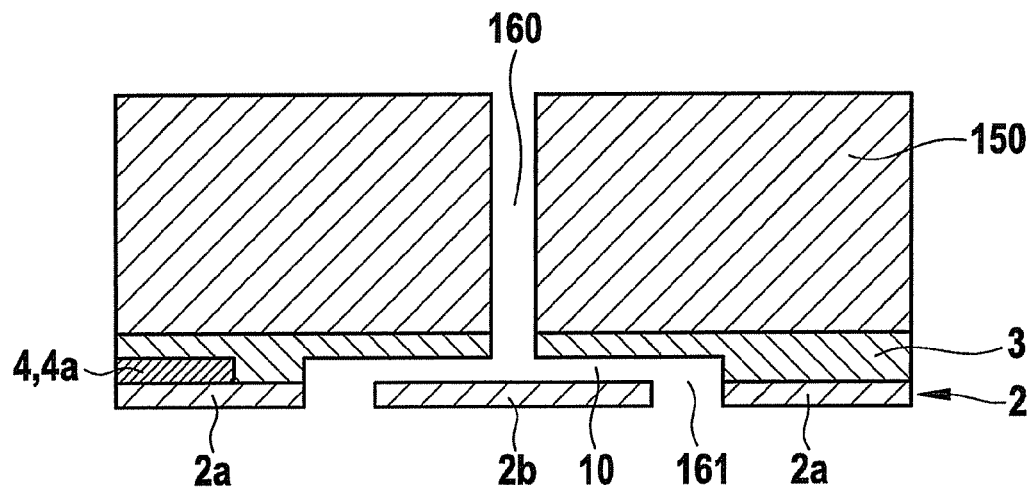
FIG. 2 shows a micromechanical component according to an example embodiment of the present invention having a cap having a closure in the open state.

FIG. 2 shows a micromechanical component according to an example embodiment of the present invention having a cap having a closure in the open state. Here a perforation 160 was formed in cap epitaxy layer 150 by etching silicon. Furthermore, as a sacrificial layer, subregion 4b of polysilicon layer 4 was likewise removed by etching. Polysilicon sacrificial layer 110 is at least partially likewise removed by etching. Thus, following the opening of perforation 160 when etching the sacrificial layer, an access 160, 161 is formed from the topside of the formed cap into a cavity 10. This access may subsequently be used for antistick-coating the micromechanical structures and for creating an internal atmosphere of a specific composition and a specific pressure. Lower nitride layer 2 forms a diaphragm 2, which is suited to close access 160, 161 by deflection in the direction of upper nitride layer 3. Diaphragm 2 has a fastening region 2a, which is anchored at least partly on upper nitride layer 3, and a closure region 2b, which is situated across from at least one perforation opening 160.

Figure 3:
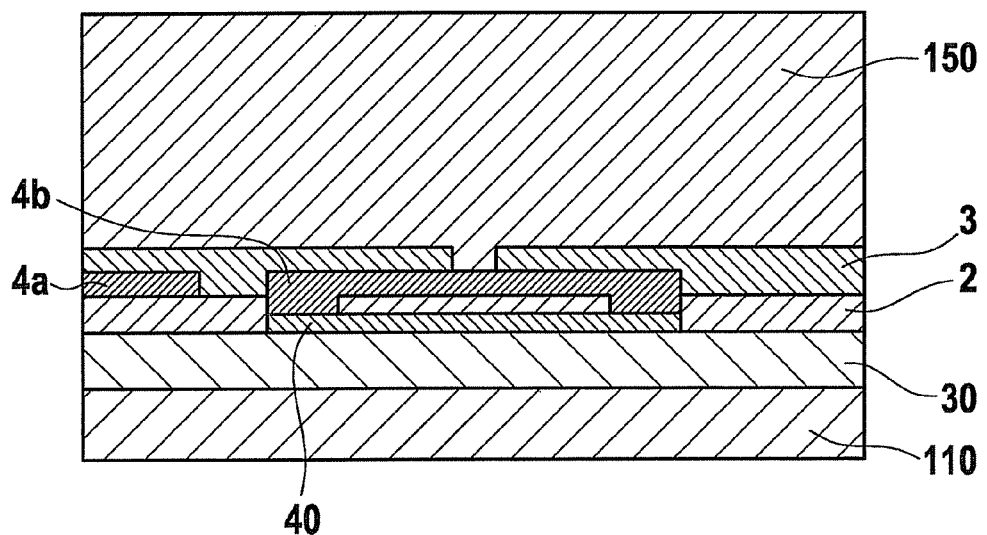
FIG. 3 shows the layer structure of a cap in another preliminary stage of the micromechanical component according to an example embodiment of the present invention having a cap having a closure.

FIG. 3 shows the layer structure of a cap in another preliminary stage of the micromechanical component according to an example embodiment of the present invention having a cap having a closure. In this refinement of the present invention, on top of polysilicon sacrificial layer 110, first an inner nitride layer 30 and on top of that an inner polysilicon layer 40 is applied and structured. This is followed, as already described, by lower nitride layer 2 and the additional layers.

Figure 4:
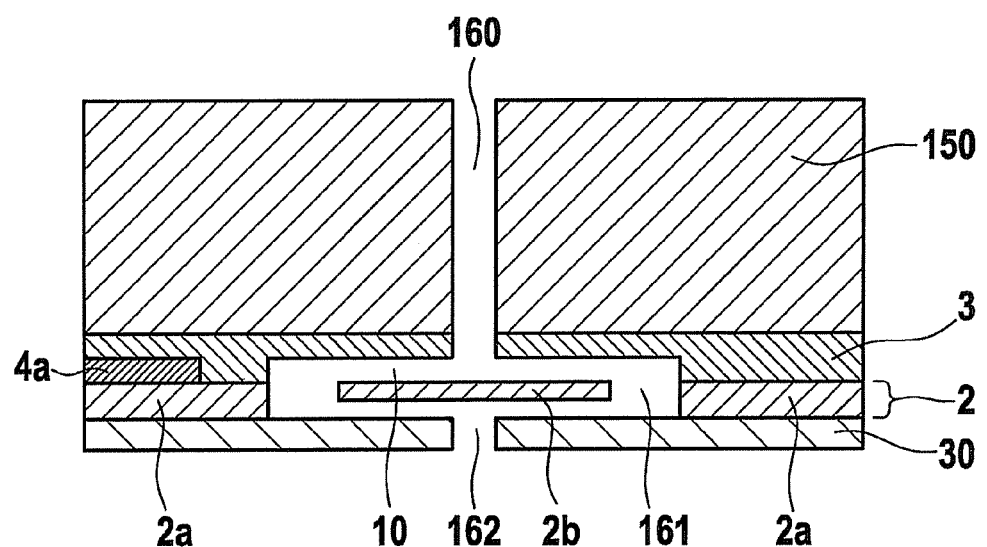
FIG. 4 shows another micromechanical component according to an example embodiment of the present invention having a cap having a closure in the open state.

FIG. 4 shows another micromechanical component according to an example embodiment of the present invention having a cap having a closure in the open state. After an etching process as shown in FIG. 2 is applied to the supplemented layer structure shown in FIG. 3, inner nitride layer 30 under diaphragm 2 is also exposed. It has an access 162, which is connected to accesses 160 and 161. Access 162 may be closed mechanically by applying diaphragm 2 to inner nitride layer 30. As already described under FIG. 2, diaphragm 2 is also suitable for closing access 160, 161 by deflecting closure region 2b of diaphragm 2 in the direction of upper nitride layer 3.

Figure 5:
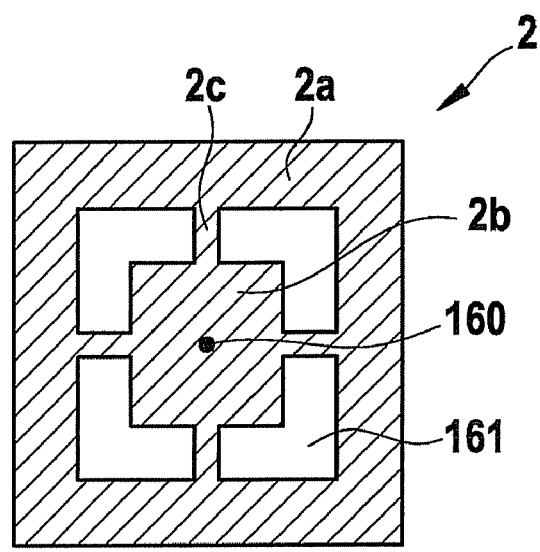
FIGS. 5 and 6 show in an exemplary manner geometrical variants of the flexible diaphragm of the closure.
Figure 6:
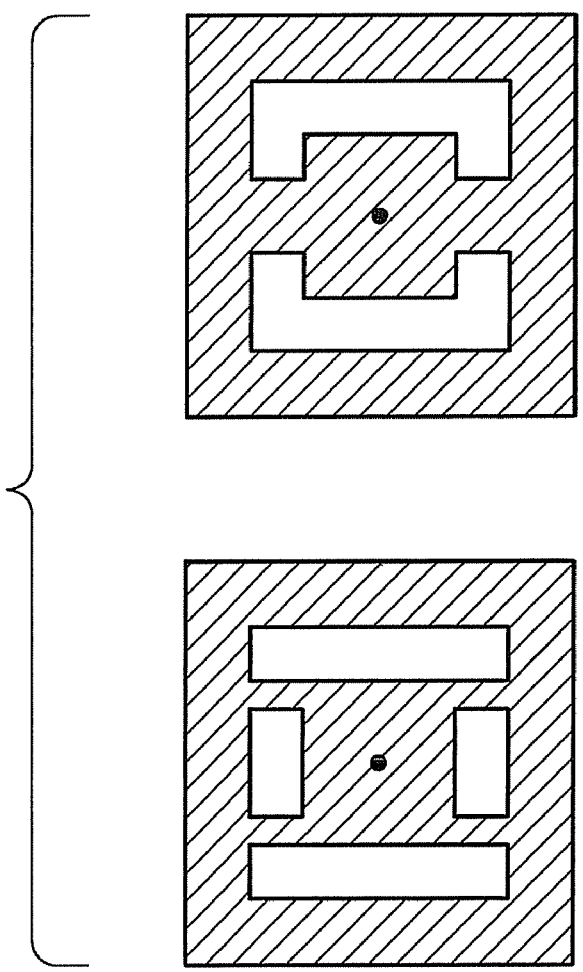

FIGS. 5 and 6 represent in an exemplary manner geometrical variants of the flexible diaphragm of the closure. Diaphragm 2 is shown having fastening region 2a, closure region 2b and connections 2c. The black circular mark indicates the position of the perforation hole (described above also as the access to the cavity) 160 in relation to diaphragm 2. Reference numeral 161 indicates the accesses through layer 2. Closure region 2b forms the sealing surface of diaphragm 2, and fastening region 2a forms the border of diaphragm 2. Connections 2c between regions 2a and 2b may be developed variously in terms of shape, number and dimension, but should preferably have flexible properties. For this purpose, FIGS. 5 and 6 show possible specific embodiments in an exemplary manner. The present invention, however, is not limited to the examples shown here.

Figure 7:
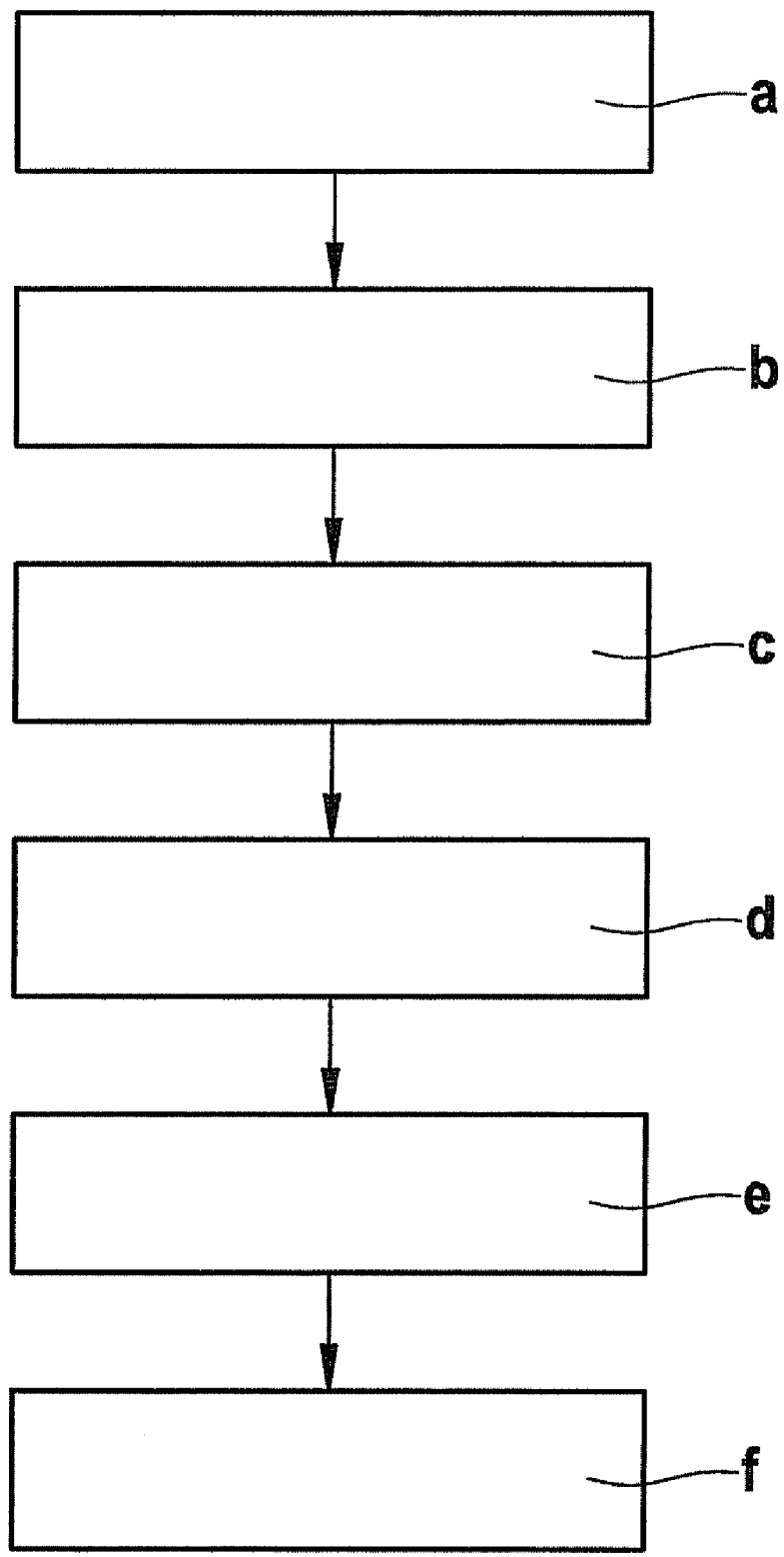
FIG. 7 schematically shows the steps of an example method according to the present invention for manufacturing a micromechanical component having a cap having a closure.

FIG. 7 schematically shows the steps of an example method according to the present invention for manufacturing a micromechanical component having a cap having a closure. A method is described for manufacturing a micromechanical component having a substrate, having a cavity 10 and having a cap bounding cavity 10. In this instance, the cap has an access opening 160, 161, 162 to cavity 10. The cap has furthermore a diaphragm 2b for closing access opening 160, 161, 162. The example manufacturing method includes the steps:

(a) providing a micromechanical component having a first sacrificial layer 110 as the uppermost layer,
(b) depositing and structuring a diaphragm layer 2,
(c) depositing and structuring a second sacrificial layer 4,
(d) depositing and structuring an etch stop layer 3,
(e) depositing a cap layer 150,
(f) introducing an access opening 160, 161; removing at least parts of second sacrificial layer 4b, exposing diaphragm 2b and removing at least parts of first sacrificial layer 110 by etching.

In an exemplary embodiment of the method, following step (a) and prior to step (b), a lower etch stop layer 30 is additionally deposited and structured, and subsequently a lower sacrificial layer 40 is deposited and structured. In addition, an access opening 160, 161, 162 is introduced in step (f), at least parts of lower sacrificial layer 40 being removed for this purpose.

Figure 8:
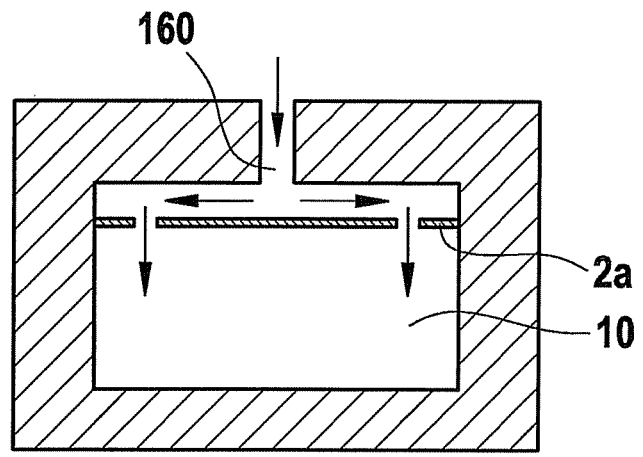
FIGS. 8, 9 and 10 show steps according to an example embodiment of the present invention for using the micromechanical component having a cap having a closure for closing the micromechanical cap as shown in FIG. 2.
Figure 9:
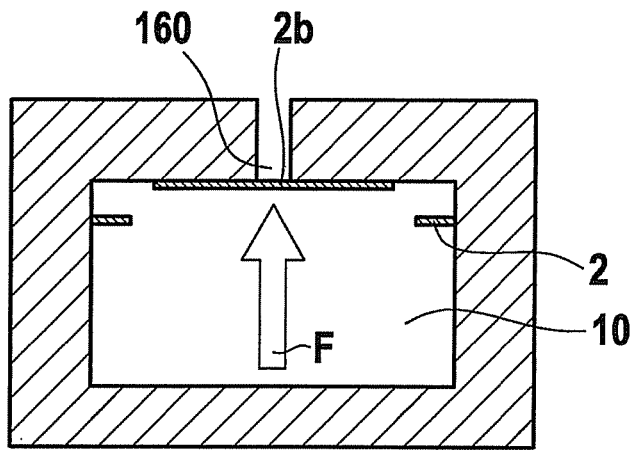
Figure 10:
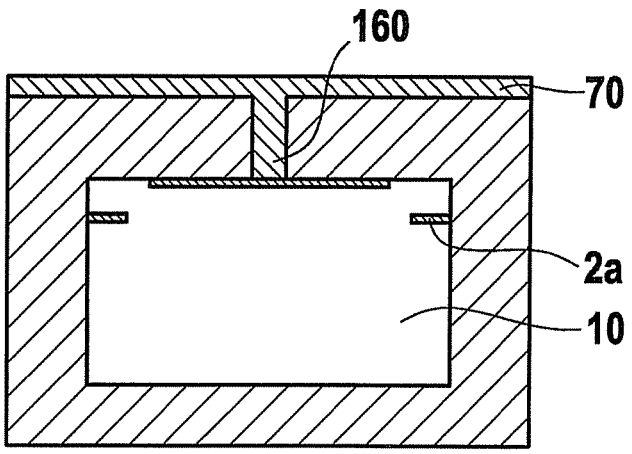

FIGS. 8, 9 and 10 represent steps according to an example embodiment of the present invention for using the micromechanical component having a cap having a closure for closing the micromechanical cap as shown in FIG. 2.

Following one or more optional process steps such as, for example, an antistick coating of surfaces within cavity 10, an interior atmosphere is set in a step (A) through perforation opening 160 in cavity 10. The setting may include in particular the composition and the pressure of the interior atmosphere.

In a second step (B), the system is then quickly evacuated and thus there is a quick pressure drop in the outer environment of the micromechanical component and its cavity 10. The pressure difference brought about between the interior atmosphere and the exterior atmosphere results in a force on diaphragm 2, as a consequence of which the closure region 2b is pressed onto the topside of the cavity. As a consequence, perforation opening 160 is mechanically closed from inside.

In a third step (C), perforation opening 160 is now closed from outside by the deposition of material. This may be performed in conventional semiconductor technology, e.g., by CVD or sputtering.

By variation in the form of a flexible diaphragm resting on the topside of the cap or by another layer 30 having sealing surfaces and pass-through opening 162 below diaphragm 2, as described above in FIGS. 3 and 4, the same mechanism may be used in another refinement of the present invention in order to enclose also low interior pressures in cavities 10. For this purpose, accordingly, the interior atmosphere is set in a first step (A), and in a second step (B) a quick pressure increase is effected in the outer environment of the micromechanical component and its cavity 10, for example, by ventilating the system using a gas. Subsequently, in a third step (C), perforation opening 160 is again closed from outside by the deposition of material. In the event that the diaphragm is situated on the outside, it is also possible to secure and seal the entire diaphragm on the outside of the cavity by material deposition.

Figure 11:
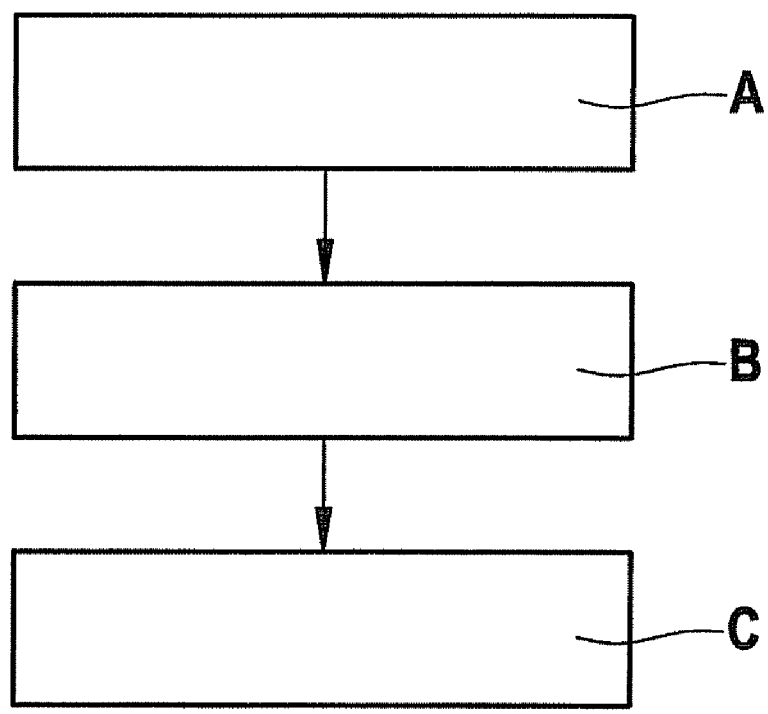
FIG. 11 schematically shows the example method steps for closing the micromechanical cap.

FIG. 11 schematically shows example method steps for closing the micromechanical cap. The example method includes the following method steps:

(A) setting an interior atmosphere in cavity 10

(B) mechanically closing cavity 10 by applying diaphragm 2b on an access (C) closing perforation opening 160 from outside by material deposition An exemplary embodiment according to the present invention provides for diaphragm 2b to be applied to a part of access opening 160, 161, 162 in step (B) by an induced pressure difference between cavity 10 and an environment of the component.

Another exemplary embodiment of the present invention provides for diaphragm 2b to be applied to a part of access opening 160, 161, 162 in step (B) by an induced electrostatic action of force.

The described micromechanical component is preferably a component based on silicon. The micromechanical component may be, for example, a control element (actuator) or a measuring element (sensor). It is especially preferred if the micromechanical component takes the form of a rate-of-rotation sensor or an acceleration sensor.

The above-described process steps of the manufacturing methods are simplified for the sake of clarity and contain, e.g., no protective structures for etching the sacrificial layer. The diaphragm was implemented in exemplary fashion as a nitride layer. Other possible suitable materials are oxide and metal (e.g. tungsten). In a refinement of the present invention having an oxide sacrificial layer, the flexible diaphragm may also be manufactured from polysilicon by small modifications of the processes.

In addition, further exemplary embodiments are also possible.

What is claimed is:

1. A micromechanical component, comprising:
a substrate having a cavity; and
a cap which bounds the cavity, the cap having an access opening to the cavity, wherein the cap has a diaphragm for closing the access opening;
wherein the diaphragm of the cap is configured to comprise an open state between opposed closing states, the open state allowing fluid communication between the access opening of the cap and the cavity of the substrate.

2. The micromechanical component as recited in claim 1, wherein the cap is a thin-layer cap.

3. The micromechanical component as recited in claim 1, wherein the diaphragm is situated under the cap.

4. The micromechanical component as recited in claim 1, wherein the diaphragm is situated above the cap.

5. The micromechanical component as recited in claim 2 wherein the diaphragm is situated in at least one layer within the cap.

6. The micromechanical component as recited in claim 1, wherein the cap has at least one perforation hole as the access opening to the cavity.

7. The micromechanical component as recited in claim 1, wherein the access opening is closed from outside by filler material.

* * * * *